(12) United States Patent
Frambach

(10) Patent No.: US 7,570,097 B2
(45) Date of Patent: Aug. 4, 2009

(54) ELECTRONIC CIRCUIT WITH LOW NOISE DELAY CIRCUIT

(75) Inventor: Johannes Petrus Antonius Frambach, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/158,315

(22) PCT Filed: Dec. 12, 2006

(86) PCT No.: PCT/IB2006/054784

§ 371 (c)(1),
(2), (4) Date: Sep. 17, 2008

(87) PCT Pub. No.: WO2007/072307

PCT Pub. Date: Jun. 28, 2007

(65) Prior Publication Data

US 2009/0051399 A1     Feb. 26, 2009

(30) Foreign Application Priority Data

Dec. 20, 2005    (EP) .................................. 05112458

(51) Int. Cl.
*H03H 11/26* (2006.01)
(52) U.S. Cl. ........................ 327/276; 327/161; 327/278; 331/43; 331/157

(58) Field of Classification Search .................. 327/155, 327/158, 159, 161, 276–278, 280–281; 331/57, 331/111, 143, 147, 177 V; 323/312–316
See application file for complete search history.

(56) References Cited

U.S. PATENT DOCUMENTS

| 5,686,867 | A | * | 11/1997 | Sutardja et al. ................ 331/57 |
| 6,107,894 | A | | 8/2000 | Van Tuijl et al. |
| 6,191,630 | B1 | | 2/2001 | Ozawa et al. |
| 7,205,855 | B2 | * | 4/2007 | Maruyama et al. ............ 331/74 |
| 2005/0057315 | A1 | | 3/2005 | Groen et al. |

FOREIGN PATENT DOCUMENTS

EP        0813303 A1    12/1997

* cited by examiner

*Primary Examiner*—An T Luu

(57) ABSTRACT

An electronic circuit comprises a delay circuit that with a chain of saw tooth delay stages (10*a-d*), coupled in a loop to form an oscillator for example. Each stage comprises an integrating circuit (104) and a current modulator (106) coupled to the integrating circuit (104). Each stage triggers a transition in the next stage when the integration result reaches a level defined by a reference voltage. Correlating circuitry (102, 30, 32, 34) is provided with current outputs to generate currents to the current modulators (106) and reference voltages for the saw tooth delay stages (10*a-d*). The reference voltages are generated at least partly from a common reference (102*c*), so that noise in the currents from the current modulators (106) and reference voltages is correlated in a way that at least partly cancels the effect of the noise on the delay time.

8 Claims, 3 Drawing Sheets

ELECTRONIC CIRCUIT WITH LOW NOISE DELAY CIRCUIT

The invention relates to a circuit that comprises a delay circuit and preferably a saw tooth oscillator comprising such a delay circuit.

U.S. Pat. No. 6,107,894 describes a saw tooth oscillator with minimized frequency noise. The saw tooth oscillator comprises a plurality of stages, each comprising an integration current source, an integrating circuit, a reference voltage source and a comparator circuit. Each stage acts as a delay stage. When a stage is active, the integrating circuit integrates the current from the integration current source and the comparator compares the reference voltage with the resulting voltage from the integrating circuit. A next stage is activated when the voltage from the integrating circuit has reached the reference voltage, which occurs with a delay after the stage has been activated. Frequency noise is minimized by using a gradual comparison mechanism, which eliminates the sensitivity to high frequency noise in the reference voltage.

Evaluation of the remaining noise from this type of oscillator shows that there is still some noise, mainly at low frequency, with 1/f noise characteristics.

Among others, it is an object of the invention to reduce an effect that causes noise in a saw tooth oscillator.

A circuit according to the invention is set forth in Claim 1. In this circuit correlating circuitry ensures that part of the unavoidable fluctuations of the integration current and the reference voltage are correlated so that their effect on the oscillator frequency substantially cancels. It has been found that an important source of the remaining frequency noise is 1/f noise in the integration current and/or the reference voltage. This 1/f noise cannot be suppressed, but by forcing this noise to have correlated but opposite effects on the oscillation frequency noise in the oscillation frequency can be cancelled.

These and other objects and advantageous aspects will become apparent from a description of exemplary embodiments, using the following figures.

Figure 1:
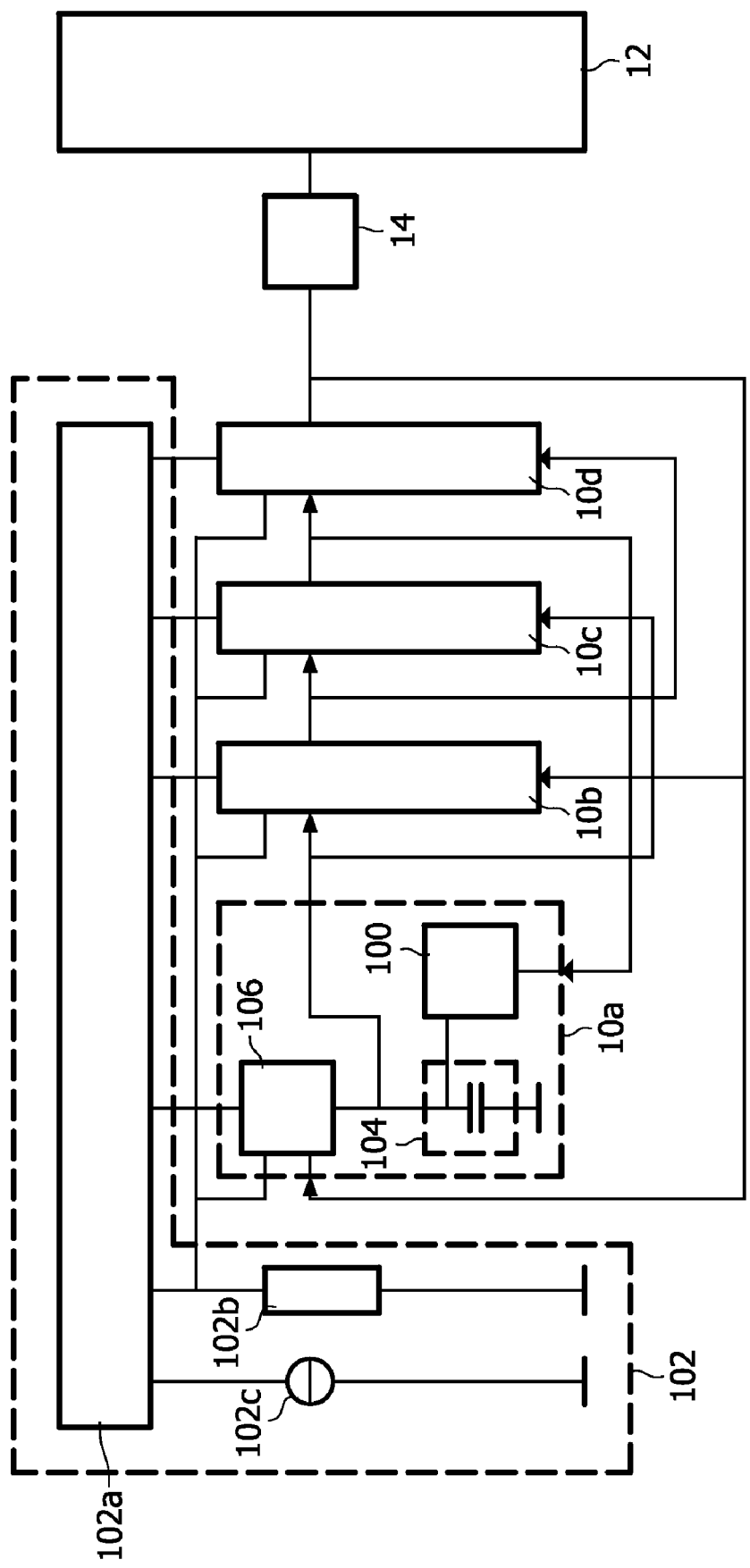
FIG. 1 shows a circuit with an oscillator.

FIG. 1 shows an electronic circuit with an oscillator coupled to a functional circuit 12 via a buffer 14. Oscillator comprises a plurality of saw tooth delay stages 10a-d, coupled in an endless loop. Functional circuit 12 is for example a receiver circuit, for which the oscillator functions as a local oscillator, or a digital circuit for which the oscillator functions as a clock circuit. Buffer 14 may contain a thresholding circuit for example. Each saw tooth delay stage comprises a reset circuit 100, a correlated current and voltage source 102, an integrating circuit 104, and a current modulator 106. A capacitor 104a has been used to implement integrating circuit 104. Reset circuit 108 is coupled to drain the integrated charge from integrating circuit 104 under control of a subsequent saw tooth delay stage 10a-d. Although not explicitly shown, one or more of the stages may be provided with a starting circuit as described in U.S. Pat. No. 6,107,894. It should be appreciated that any number of saw tooth delay stages may be used in an oscillator.

Correlated current and voltage source 102 has a current output coupled to integrating circuit 104, which has an output coupled to a first control input of current modulator 106. Correlated current and voltage source 102 has a reference voltage output coupled to a second control input of current modulator 106. By way of example correlated current and voltage source 102 has been implemented as a series of outputs of a current mirror 102a, with a constant current source 102c at its input and respective outputs functioning as current output for respective saw tooth delay stages 10a-d, another output being coupled to a resistance 102b and functioning as a reference voltage output to each of the saw tooth delay stages 10a-d. Thus, Correlated current and voltage source 102 operates as correlating circuitry which ensures that fluctuations the current from current source 102c lead to correlated fluctuations in the output currents and the reference voltage.

Current modulator 106 is coupled between a current output of correlated current and voltage source 102 and integrating circuit 104. Current modulator 106 has differential control inputs, a first one acting as a chain input coupled to the integrating circuit 104 of a preceding saw tooth delay stage 10a-d and second one acting as reference input coupled to the reference voltage output of correlated current and voltage source 102.

In operation a saw tooth delay stage 10a-d starts a delay cycle when current modulator 106 starts allowing current to integrating circuit 104 from correlated current and voltage source 102. When the resulting integration voltage approaches a level corresponding to the voltage supplied at the reference voltage output of correlated current and voltage source 102, the current modulator 106 of the next saw tooth delay stage is activated. Also, the rising integration voltage also causes the reset circuit 100 of a preceding stage to rest the integrating circuit 104 of that stage.

Correlated current and voltage source 102 ensures that low frequency noise in the integration current is correlated with noise in the reference voltage (low frequency noise, as used here refers to noise at frequencies much lower than the oscillator frequency). Thus, slower integration due to a lower integration current is accompanied with a proportionally smaller reference level, with the net effect that the delay time of the stage is unaffected. In this way the effect of 1/f noise is counteracted. It has been found that transistors form a major source of 1/f noise. As a result the reference current for the operation of the oscillator (from current source 102c), which is preferably produced with some temperature variation compensating circuit typically forms a major source of 1/f noise that affects the frequency of the oscillator. The circuit ensures that this noise does not affect the oscillation frequency.

Figure 2:
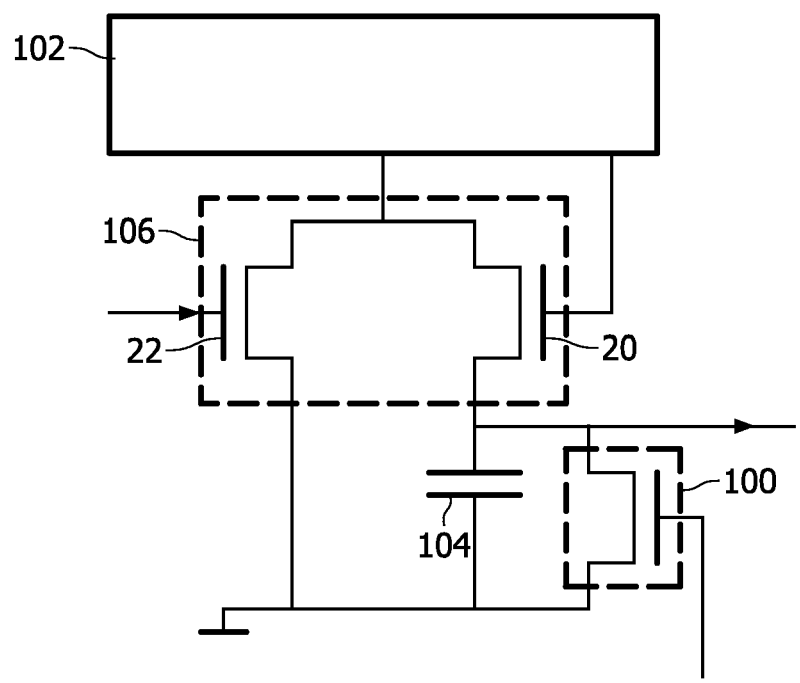
FIGS. 2-4 show saw tooth delay stages.

FIG. 2 shows an embodiment of a delay stage 10 wherein current modulator 106 is realized by a first and second transistor 20, 22. The sources of first and second transistor 20, 22 are both coupled to the current source output of correlated current and voltage source 102. The gate of first transistor 20 is coupled to the voltage source output of correlated current and voltage source 102. The drain of first transistor 20 is coupled to integrating circuit 104. The gate of second transistor 22 is coupled to the input of the delay stage 10 and the drain of second transistor 22 is coupled to ground. In operation first and second transistor 20 act as a differential amplifier, which ensures a gradual rise of the current supplied to integrating circuit 104 in response to a rising saw tooth input voltage. This has the consequence that rapid fluctuations, if any, in the voltage at the reference voltage output of correlated current and voltage source 102 will have no significant effect on oscillation frequency.

Figure 3:
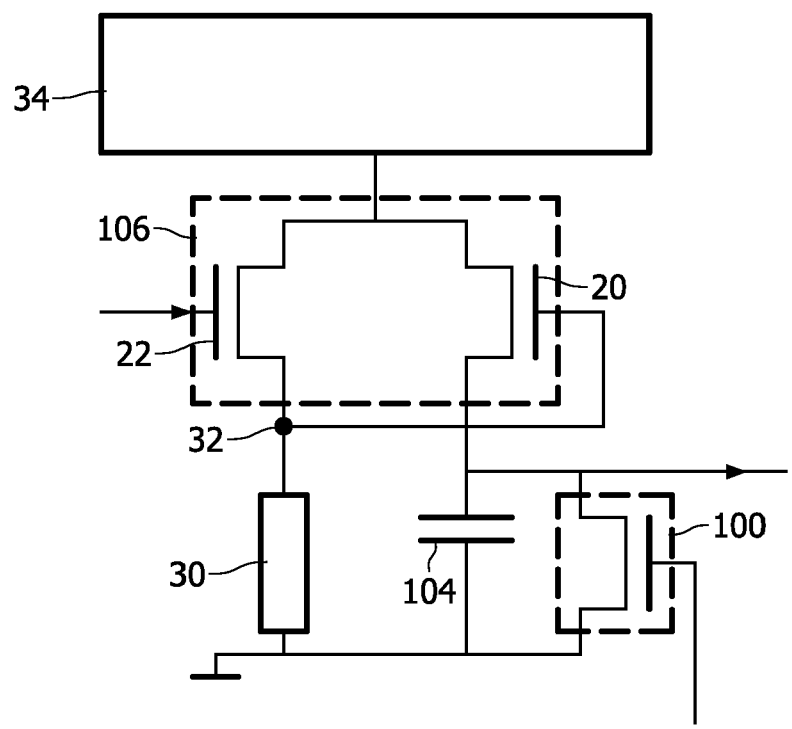

FIG. 3 shows an embodiment of a saw tooth delay stage 10 wherein the drain of second transistor 22 is coupled to ground via a resistance 30. A node 32 between the drain and resistance 30 serves as a reference voltage output and is coupled to the gate of first transistor 20. The sources of the first and second transistor 20, 22 are coupled to an output of a current mirror 34 that supplies current to each of the saw tooth delay stages. Thus, the coupling to the gate acts as part of the correlating circuitry, which ensures that low frequency fluctuations in the current from a current mirror 34 are correlated with fluctuations in the reference voltage at the gate.

In this way a time varying reference voltage is generated. As a result, the operation of the circuit is different from that of the earlier circuit. Initially, the current through resistance 30 is high and so the reference voltage is high. When the integration voltage received at the gate of second transistor 22 from a preceding saw tooth delay stage (not shown) starts to approach this high reference voltage, current is increasingly rerouted from second transistor 22 to first transistor 20, which causes a drop in the reference voltage. This drop in turn increases the speed of rerouting, so that a less gradual onset of the current to integration circuit 104 is realized.

The current from current mirror 34 defines the speed of integration as well as the level of the input voltage at the gate of second transistor 22 that leads to the onset of the current to integrating circuit 104. As a result the effect of low frequency fluctuations in the current from current mirror 34 on the oscillation frequency is suppressed. Also, in contrast to FIG. 1, since the additional output of current mirror 34 that is used to generate the reference voltage in FIG. 1 is not present in the circuit of FIG. 3, 1/f noise due to the use of this additional output is removed. Also differences between components of the current mirror due to process spread have less effect on frequency.

One potential disadvantage of the circuit of FIG. 3 is that the gain of the amplifier realized by first and second transistor 20, 22 affects the oscillation frequency. Thus, a temperature dependence may arise. In a further embodiment a capacitor (not shown) may be placed in parallel circuit with resistance 30 with a capacitance value so that an RC time of this capacitor and resistance 30 is larger (preferably much larger) than the delay time of the saw tooth delay stage. In a further embodiment a sampling circuit may be used to decouple this capacitor and the gate of first transistor 20 from resistance 30 during integration. In another embodiment nodes 32 of different stages may be coupled together to a resistance to generate an averaged reference voltage.

Figure 4:
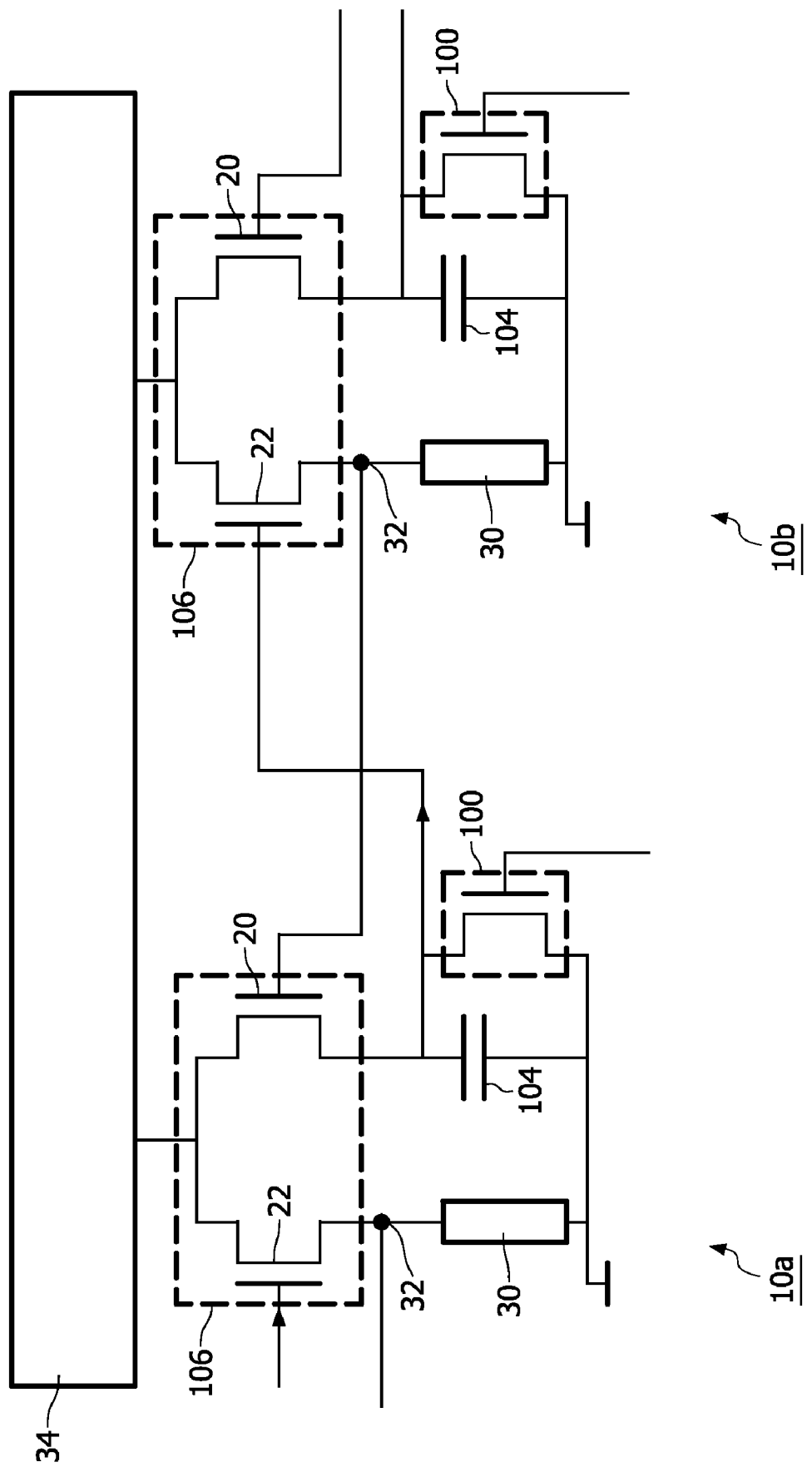

FIG. 4 shows an embodiment of a saw tooth delay stage wherein the drain of second transistor 22 in a saw tooth delay stage 10a,b is coupled to ground via a resistance 30. A node 32 between the drain and resistance 30 of stage 10b serves as a reference voltage output. In contrast with the preceding figure, node 32 is coupled to the reference voltage input of a preceding stage 10a. In this way the reference voltage at the time when the integration voltage approaches the reference voltage does not depend on the gain, nor, through the gain, on temperature. Thus, the coupling to the gate acts as part of the correlating circuitry, which ensures that low frequency fluctuations in the current from one output of current mirror 34 to one stage are correlated with fluctuations in the reference voltage at the gate of the second transistor of another stage. The effect of noise in the reference current on the oscillation frequency is cancelled as before, because fluctuations in the reference voltage and the integration current have opposite effects on the oscillation current.

Moreover, noise contributions from different outputs of current mirror 34 to the oscillation frequency are also cancelled. Any local increase in the integration current of a saw tooth delay stage (with a concomitant decrease in delay time) is compensated by an increase of the reference voltage for the preceding stage (with a concomitant increase in delay time of that preceding stage). Preferably, node 32 of each saw tooth delay stage in the oscillator is coupled to its respective preceding saw tooth delay stage. Thus, the noise contribution from each current output is cancelled. Although coupling of node 32 to the reference voltage input of an immediately preceding saw tooth delay stage is shown, it should be appreciated that the node 32 may be coupled to the reference voltage input of a saw tooth delay stage that is further apart with the same canceling effect. In fact, the distance between the saw tooth delay stage that contains the node and the saw tooth delay stage where the voltage from the node is used as a reference need not even be the same for all saw tooth delay stages. Even the node 32 in each saw tooth delay stage is not coupled to a respective other saw tooth delay stage (some nodes 32 being coupled to more than one stage for example and others to none, or a reference circuit like that of FIG. 1 being used for others) some amount of cancellation is still realized.

Although specific examples have been shown, it should be appreciated that variations are possible. For example, it should be appreciated that any number of saw tooth delay stages may be used in an oscillator. Although four are shown in FIG. 1, six or any other number greater than one may be used. Furthermore, it should be appreciated that considerable freedom exists in the selection of connection between stages. The sequence of the stages is determined by the sequence in which outputs of the stages are coupled to chained inputs. For example, although FIG. 1 shows use of a reset signal from two saw tooth delay stages ahead in such a sequence, it should be appreciated that a reset signal from a saw tooth delay stage at a different position in the sequence may be used. Also, although a simple reset circuit with a transistor that for shunting the capacitor in the integrating circuit 104 has been shown, it should be appreciated that more complicated circuits may be used, for example as described in U.S. Pat. No. 6,107,894. Also, although examples of oscillator circuits have been shown, it should be appreciated that the saw tooth delay stage and in particular a series of such stages may also be used as an accurate delay circuit. Similarly the reference voltages from nodes 32 may be applied to the reference input of a stage at a different distance in the sequence.

Furthermore, although embodiments with a fixed frequency oscillator have been shown, it should be appreciated that alternatively an oscillator with a controllable frequency may be used. This may be realized for example, by using an adjustable resistance (or resistances) to generate the reference voltage. In one embodiment a series arrangement of resistances is used, with switches coupled to the resistances to shunt at least part of the resistances. Thus a digital adjustment of the oscillator frequency can be made. The switches may introduce additional 1/f noise, but by using switches to shunt only one or a part of the resistances the noise effect can be kept small. In another embodiment selectively on/off switchable parallel current outputs may be used in the current mirror 102a, 34 to provide a digitally controlled integration current and/or current to the reference voltage output. In other embodiments on/off switchable or continuously adjustable additional currents may be fed to the resistances and/or the integrating circuit outside the first and second transistors 20, 22 to adjust the frequency. As will be appreciated, any such current will make the cancellation of noise effects less perfect, but when relatively small additional currents are used, a considerable amount of cancellation can still be realized. In a further embodiment any type of digital adjustment may be combined with sigma delta techniques to realize an adjustable average oscillation frequency.

Furthermore, although simple examples of preferred integrating circuits and current modulators have been shown, it should be appreciated that more complicated circuits can be used. For example, if high frequency noise is no problem, a more abrupt (on/off) current modulation may be used, using for example a comparator circuit to control a switch between the current source output of correlated current and voltage source 102 and integrating circuit 104. Furthermore, although preferably resistors are used as resistances 102b, 30, it should be understood that alternatively a "resistance" as used herein may any other circuit that produces a voltage dependent on a current flowing through the circuit. Similarly although various voltages are generated by means of a resistance, it should be understood that without affecting operation of the circuit further resistances may be placed in series with such resistances which do not affect the generated voltage.

The invention claimed is:

1. An electronic circuit, comprising a delay circuit that comprises a chain of saw tooth delay stages and correlating circuitry, each saw tooth delay stage comprising an integrating circuit and a current modulator coupled between the integrating circuit and a respective current output of the correlating circuitry, the current modulator of each successive saw tooth delay stage having a reference input and a chained input coupled to an output of the integrating circuit of a preceding saw tooth delay stage in the chain, the correlating circuitry being coupled to the reference input of the current modulator of at least a first one of the saw tooth delay stages, the correlating circuitry being arranged to generate a current from at least one of the current outputs and a reference voltage at the reference input of said first one of the saw tooth delay stages at least partly from a common reference.

2. An electronic circuit according to claim 1, wherein the current modulator coupled to said at least one of the current outputs of the correlation circuitry comprises a current splitter circuit, having an input coupled to the respective current output of the correlating circuitry and first and second outputs coupled to the integrating circuit and a resistance respectively, the current modulator being arranged to modulate a ratio between currents through the first and second outputs under control of a difference between voltages at the chained input and the reference input, a node between the second output and the resistance being coupled to the reference input of said first one of the saw tooth delay stages.

3. An electronic circuit according to claim 2, wherein the current modulator that is coupled to said at least one of the current outputs is the current modulator of a second one of the saw tooth delay stages other than the first one of the saw tooth delay stages.

4. An electronic circuit according to claim 1, wherein the current modulator of each saw tooth delay stage comprises a current splitter circuit, having a current input coupled to the respective current output of the correlating circuitry and first and second outputs coupled to the integrating circuit and a resistance of the saw tooth delay stage respectively, the current modulator being arranged to modulate a ratio between currents through the first and second outputs under control of a difference between voltages at the chained input and the reference input, the saw tooth delay stages being coupled in an oscillator loop, a node between the second output and the resistance of each particular saw tooth delay stage being coupled to the reference input of a respective different saw tooth delay stage.

5. An electronic circuit according to claim 2, wherein said at least one of the current outputs is coupled to the first one of the saw tooth delay stages.

6. An electronic circuit according to claim 1, wherein the correlating circuitry comprises a reference current source and a current mirror comprising a current mirror input coupled to the reference current source and a plurality of current mirror outputs forming the current outputs coupled to the current modulators of respective ones of the saw tooth delay circuits.

7. An electronic circuit according to claim 2, comprising a resistance coupled to a further current mirror output of the current mirror, a node between the resistance and the further current mirror output being coupled to the reference input of said first one of the saw tooth delay stages.

8. An electronic circuit according to claim 1, wherein the saw tooth delay stages are coupled in an oscillator loop.

* * * * *